United States Patent [19]
Watanabe et al.

[11] Patent Number: 5,276,386
[45] Date of Patent: Jan. 4, 1994

[54] MICROWAVE PLASMA GENERATING METHOD AND APPARATUS

[75] Inventors: Seiichi Watanabe; Makoto Nawata; Ryooji Fukuyama, all of Kudamatsu; Yutaka Kakehi; Saburo Kanai, both of Hikari; Yoshinao Kawasaki, Yamaguchi, all of Japan

[73] Assignee: Hitachi, Ltd., Chiyoda, Japan

[21] Appl. No.: 669,512

[22] Filed: Mar. 14, 1991

[51] Int. Cl.$^5$ .............................. H05H 1/46
[52] U.S. Cl. ..................... 315/111.210; 315/39; 333/99 P L; 333/157; 313/231.31
[58] Field of Search .............. 333/99; 331/126; 313/231.31; 315/39, 39

[56] References Cited

U.S. PATENT DOCUMENTS

| | | | |
|---|---|---|---|
| 2,812,467 | 11/1957 | Kompfner | 315/39.3 X |
| 2,912,695 | 11/1959 | Cutler | 333/157 X |
| 3,029,361 | 4/1962 | Hernquist | 315/39 X |
| 3,317,784 | 5/1967 | Ferrari | 333/99 PL |
| 3,378,723 | 4/1968 | Napoli et al. | 315/39 |
| 3,432,721 | 3/1969 | Naydan et al. | 315/39 |
| 3,470,489 | 9/1969 | Paik | 331/126 X |
| 3,663,858 | 5/1972 | Lisitano | 315/39 |
| 3,814,983 | 6/1974 | Weissfloch et al. | 315/111.21 X |
| 4,847,460 | 7/1989 | Kieser et al. | 219/10.55 A |
| 4,877,509 | 10/1989 | Ogawa et al. | 204/298.37 |
| 4,912,367 | 3/1990 | Schumacher et al. | 313/231.31 X |

FOREIGN PATENT DOCUMENTS

| | | |
|---|---|---|
| 360534 | 3/1990 | European Pat. Off. |
| 398832 | 11/1990 | European Pat. Off. |
| 1-187919 | 7/1989 | Japan |
| 2-16732 | 1/1990 | Japan |
| 2-82524 | 3/1990 | Japan |
| 1175416 | 12/1969 | United Kingdom |

Primary Examiner—Benny T. Lee
Attorney, Agent, or Firm—Antonelli, Terry Stout & Kraus

[57] ABSTRACT

In a microwave plasma generating method and apparatus according to the present invention, a slow wave structure is disposed in the propagation region of microwaves, and the microwaves are introduced at a delayed phase velocity into a discharge chamber so that treating gases are transformed into plasma. Thus, the phase velocity of the microwaves is adjusted to a relatively low velocity, at which charged particles are distributed most densely in the plasma, so that the energy may be efficiently transformed to many more charged particles in the plasma. Thus, the plasma of high density is generated to improve a plasma treating rate.

19 Claims, 11 Drawing Sheets

MICROWAVE PLASMA GENERATING METHOD AND APPARATUS

BACKGROUND OF THE INVENTION

1. Field of the Invention

The present invention relates to a microwave plasma treating method and a system therefor and, more particularly, to a method of and a system for microwave plasma treatment, which are suitable for etching or forming a film on a specimen such as a semiconductor element substrate with plasma.

2. Description of the Prior Art

A microwave plasma treating system of the prior art provides a uniform plasma density, as disclosed in Japanese Patent Laid-Open No. 16732/1990 (corresponding to U.S. Pat. No. 4,877,509), for example, by disposing circularly polarized wave transforming means in a waveguide, in which the microwaves propagate, to rotate the oscillating direction of the microwaves by 90 degrees for every quarter period so that the oscillating direction may make one rotation for one period.

This prior art system has not taken into consideration the phase velocity of the microwaves, which will exert influences upon the efficiency for energy transformations from the microwaves to the charged particles in the plasma, so that the density of plasma is yet to be increased.

In another prior art system (as disclosed in Japanese Patent Laid-Open No. 187919/1989), on the other hand, a cylindrical dielectric member is fitted in the circumferential wall of a plasma generating chamber to provide a uniform electric field in the plasma generating chamber so a film can be uniformly formed on the surface of a specimen while blocking formation of the plasma at the outer circumference of the plasma generating chamber, to enhance the energy efficiency.

This prior art system also has failed to take into consideration into the phase velocity of the microwaves, which will exert influences upon the efficiency for energy transformations from the microwaves to the charged particles in the plasma, so that the density of the plasma fall short of a desired level.

Another prior art system relating to the present invention is disclosed in Japanese Patent Laid-Open No. 82524/1990 (corresponding to U.S. Pat. No. 4,960,073). According to this disclosure, a frusto-conical block is disposed in the plasma generating chamber to introduce the microwaves efficiently without any loss and uniformly into the plasma generating chamber so that the plasma may be generated uniformly at high density all over the inside of the plasma generating chamber. This prior art system also has failed to take into consideration the phase velocity of the microwaves, which will exert influences upon the efficiency for the energy transformations from the microwaves to the charged particles in the plasma.

SUMMARY OF THE INVENTION

An object of the present invention is to provide a method of and a system for microwave plasma treatment which can improve the plasma treating rate by generating plasma of high density.

According to the present invention, there are provided a microwave plasma treating system in which a slow wave structure is disposed in the propagation region of microwaves; and a microwave plasma treating method in which the phase velocity of microwaves is delayed to transform treating gases into plasma with said microwaves so that a specimen may be treated. Thus, the phase velocity of the microwaves is adjusted to a relatively low velocity, at which velocity distribution of charged particles in the plasma is most dense, to transform the energy efficiently to much more charged particles in the plasma, so that plasma of high density may be generated to improve the plasma treating rate.

DESCRIPTION OF THE PREFERRED EMBODIMENTS

A first embodiment of the present invention will be described with reference to FIGS. 1 to 3.

Figure 1:
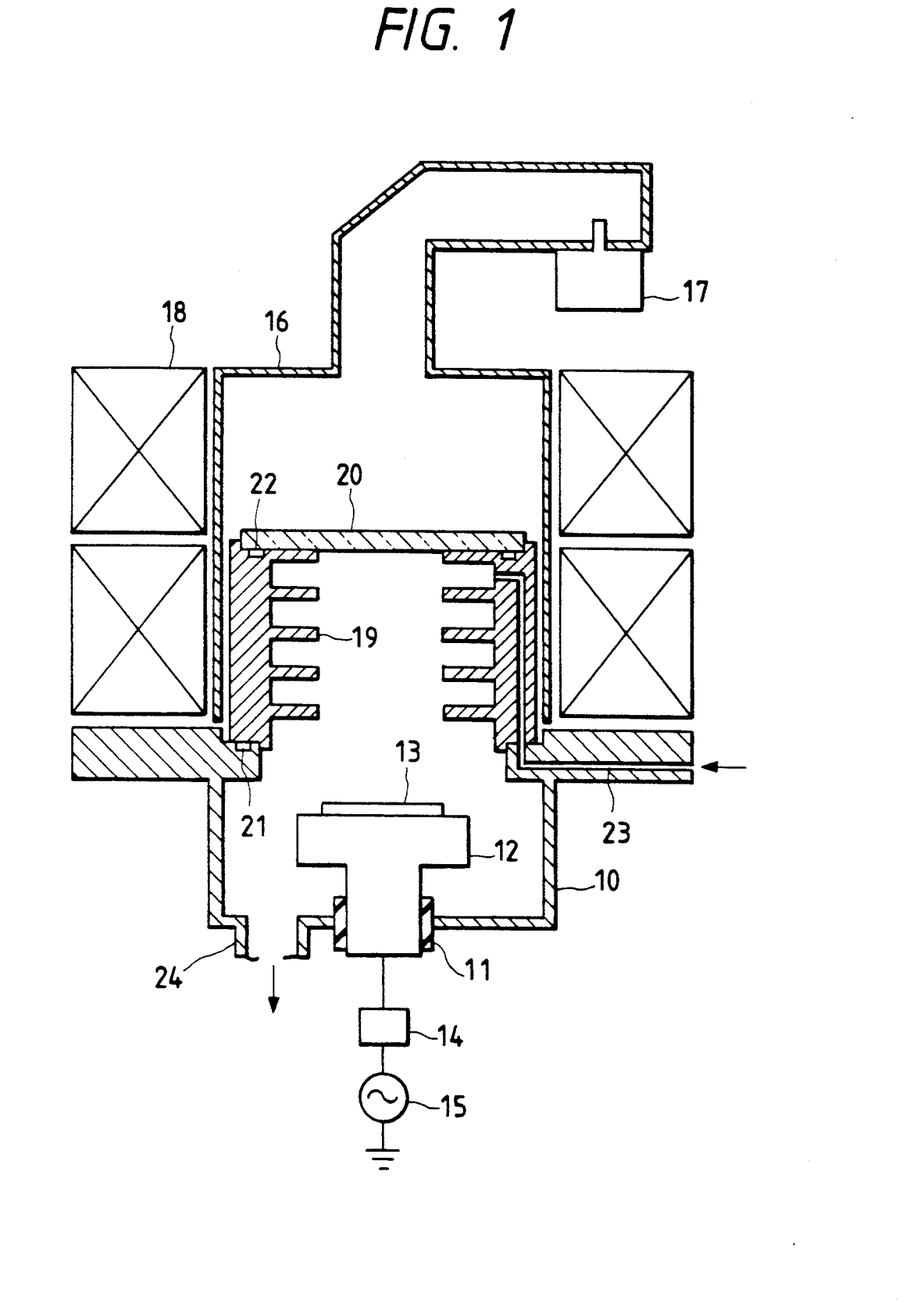
FIG. 1 is a longitudinal section showing a magnetic field microwave plasma etching system according to a first embodiment of the present invention.

FIG. 1 shows a microwave plasma treating system according to the present invention, which is exemplified by a magnetic field microwave plasma etching system. In the upper opening of a treating chamber 10, there is disposed gas-tight through a vacuum seal 21 a hollow slow wave structure 19 which is made of a non-magnetic and conductive material such as aluminum. The slow wave structure 19 is grounded to the earth potential. A plate-shaped quartz window 20 is disposed gas-tight in the upper opening of the slow wave structure 19 through a vacuum seal 22. A specimen bed 12 is disposed on the bottom of the treating chamber 10 through an electric insulator 11. Thus, a vacuum treating chamber also acting as a plasma generating chamber is defined by the treating chamber 10, the slow wave structure 19 and the quartz window 20. In this case, the plasma generating chamber is formed of the slow wave structure 19 and the quartz window 20. The specimen bed 12 can position the surface of a specimen 13 to be treated, in a manner to face the hollow portion of the slow wave structure 19. In this case, the treating chamber 10 and the slow wave structure 19 are formed with a supply passage 23 for introducing the treating gases from its source (not shown) to the upper portion in the slow wave structure 19. The treating chamber 10 is formed on its bottom with an evacuation outlet 24 which is connected to an evacuator (not shown) capable of evacuating the inside of the vacuum treating chamber to a predetermined pressure. The specimen bed 12 is connected through a matching box 14 to a high-frequency power source 15. Above the treating chamber 10, there is disposed a waveguide 16 which encloses the outer circumference of the slow wave structure 19 and the quartz window 20. At an end of the waveguide 16, there is disposed a magnetron 17 which can generate microwaves. The outside of the slow wave structure 19 and the outer circumference of the waveguide 16 are surrounded by a solenoid coil 18.

Figure 2:
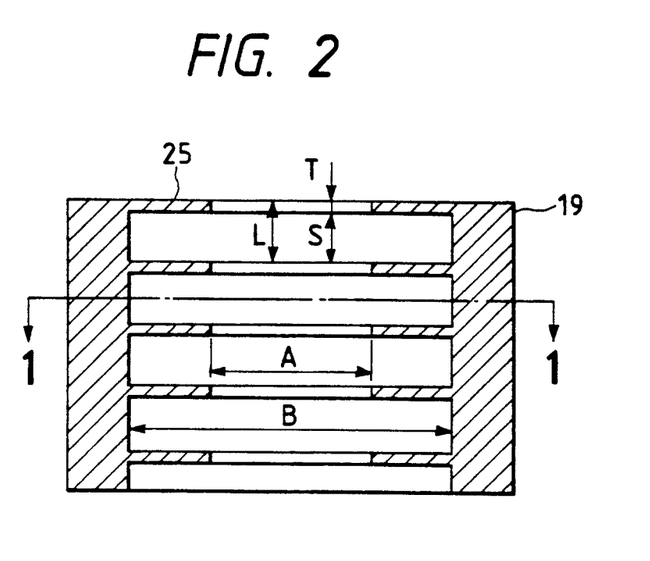
FIG. 2 is a longitudinal section showing the detail of a slow wave structure of the system of FIG. 1.
Figure 3:
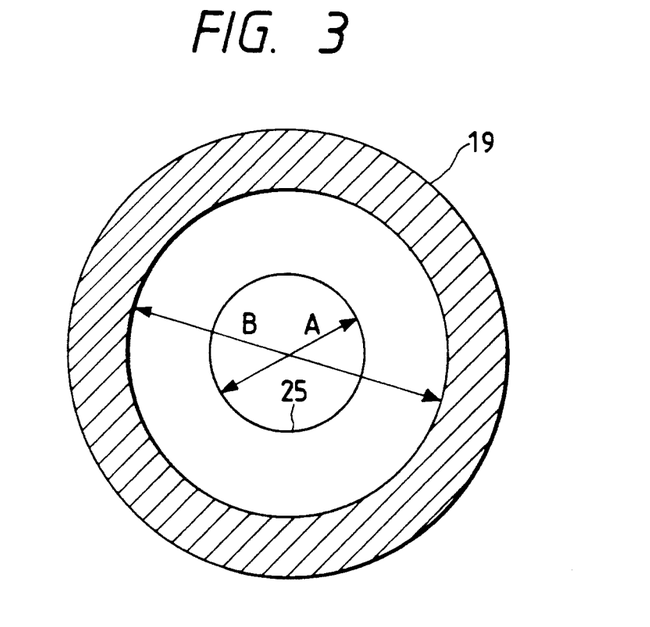
FIG. 3 is a sectional top plan view showing the slow wave structure, as taken along section 1—1 in FIG. 2.

In this case, as shown in FIGS. 2 and 3, the slow wave structure 19 is a kind of waveguide, which is formed into a cylinder having a plurality of disc-shaped projections 25 each having an internal diameter A, an external diameter B and a thickness T (FIG. 2 only) and arranged equidistantly at a pitch L (FIG. 2 only).

In the system thus constructed, the inside of the vacuum treating chamber is evacuated by the evacuator, and the treating gases exemplified by etching gases in this case are then introduced by the treating gas source into the slow wave structure and the treating chamber 10 via the gas passage 23 to be controlled to a predetermined pressure. Then, the solenoid coil 18 is energized by the not-shown power source. As a result, a magnetic field toward the specimen bed 12 is generated in the slow wave structure 19 and the treating chamber 10 by the solenoid coil 18. The specimen 13 is positioned in the magnetic field. Moreover, the magnetron 17 is energized to generate the microwaves by the not-shown power source. The microwaves are generated to have a frequency of 2.45 GHz in this case by the magnetron 17 and propagate in the waveguide 16 to be projected through the quartz window 20 into the slow wave structure 19. At this time, the microwaves thus incident through the quartz window 20 will propagate in the slow wave structure 19 while having their phase velocity delayed by the slow wave structure 19. The treating gases in the slow wave structure 19 are transformed into a plasma by the interactions between the electric field of the microwaves having the delayed phase velocity and the magnetic field provided by the solenoid coil 18. By thus delaying the phase velocity of the microwaves, the energy of the microwaves is efficiently transmitted to the treating gases so that the gases are efficiently transformed into the plasma.

For transforming the treating gases into the plasma, more specifically, the energy transformation between the microwaves and the charged particles is the most efficient when the phase velocity of the microwaves and the velocity of the charged particles are substantially equal. Thus, the efficiency for plasma transformations can be improved by adjusting the phase velocity of the microwaves to a velocity, at which charged particles having a substantially equal velocity are distributed most densely. Here, the charged particles in the plasma have various velocities from that of light to zero, and most of them have a relatively low velocity with respect to the velocity of light, as assumed by the Maxwell distribution. Hence, the phase velocity of the microwaves is so delayed by the slow wave structure 19 such that it corresponds to the relatively low value, at which velocity distribution of the charged particles in the plasma is most dense. Incidentally, the phase velocity of the microwaves is desirably as close as possible to the most possible velocity at which velocity distribution of charged particles in the plasma is most dense. As a result, more charged particles in the plasma absorb the energy of the microwaves efficiently so that they can be transformed into the plasma to provide high density plasma in the plasma generating chamber.

The plasma treating rate, e.g., the etching rate in this case is improved if the specimen 13 arranged on its bed 12 is etched with the plasma of high density thus generated. In this case, the etched shape of the specimen 13 is controlled by the high-frequency voltage which is applied to the specimen bed 12 from the high-frequency power source 15.

In the present first embodiment, for example, the specimen is a wafer of 6 inches, and the disc-shaped projections 25 (see FIGS. 2 and 3) of the slow wave structure 19 had a pitch L one quarter (e.g., 32.3 mm in this case) as long as the guide wavelength of the microwaves and had an internal diameter A of 130 mm, an external diameter B of 180 mm and a thickness T of 3 mm. The etching conditions were: the treating or etching gas was $CHF_3$; the etching pressure was 10 mTorrs; the microwave output was 1 KW; and the high-frequency power source frequency was 800 KHz. Under these etching conditions, the etching rate of $SiO_2$, when the slow wave structure 19 was used, was improved to 786 nm/min., i.e., about 1.6 times as high as the etching rate of 485 nm/min. of $SiO_2$, when the slow wave structure 19 was not used.

As has been described hereinbefore, according to the present first embodiment, there can be attained an effect that the plasma treating rate is improved, because the phase velocity of the microwaves can be adjusted by the slow wave structure 19 to a velocity, at which charged particles having similar velocities are most frequent, to generate the plasma of high density.

Incidentally, in the first embodiment, the pitch L of the discs of the slow wave structure 19 was one quarter as long as the guide wavelength of the microwaves. Generally speaking, however, if the period of the slow wave structure having the periodic structure (in which the projections 25 are disposed at predetermined intervals) is one N-th (N: a positive integer) as long as the guide wavelength of the microwaves passing therethrough, the electromagnetic distribution of the microwaves are periodically formed to make the generated plasma more stable.

Figure 4:
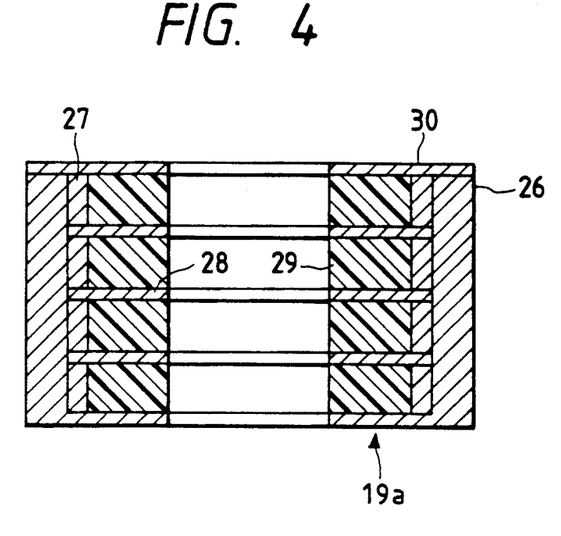
FIG. 4 is a longitudinal section showing another example of the slow wave structure of an assembled type of the system of FIG. 1.

In the present first embodiment, the slow wave structure 19 is exemplified by one formed integrally with the disc-shaped projections 25. As shown in FIG. 4, however, the slow wave structure 19 may be assembled, as indicated at 19a. In this case, the slow wave structure 19a is assembled into the shape shown in FIG. 2, by stacking a plurality of spacers 27 and discs 28 made of a non-magnetic conductor alternately one on the other in an outer cylinder 26 likewise made of a non-magnetic conductor and having one disc-shaped end, and by holding the other end of the outer cylinder 26 with a holder 30 likewise made of a non-magnetic conductor, to fix the spacers 27 and the discs 28 in the outer cylinder 26. Moreover, the phase velocity of the microwaves can be delayed by disposing dielectric members 29 in the spaces formed by the spacers 27 between the discs 28.

Figure 5:
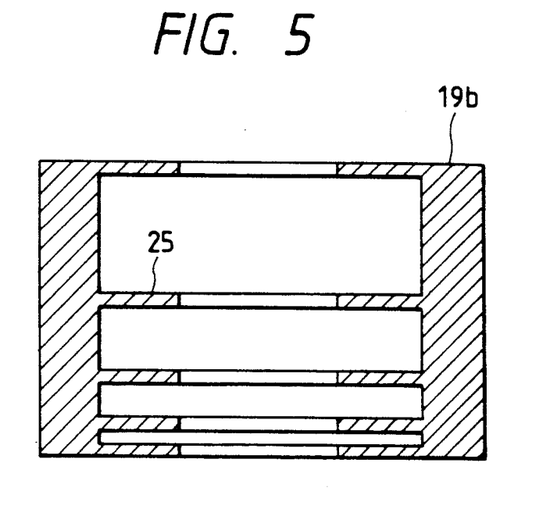
FIG. 5 is a longitudinal section showing another embodiment of the slow wave structure of the system of FIG. 1, in which the intervals of projections are varied.
Figure 6:
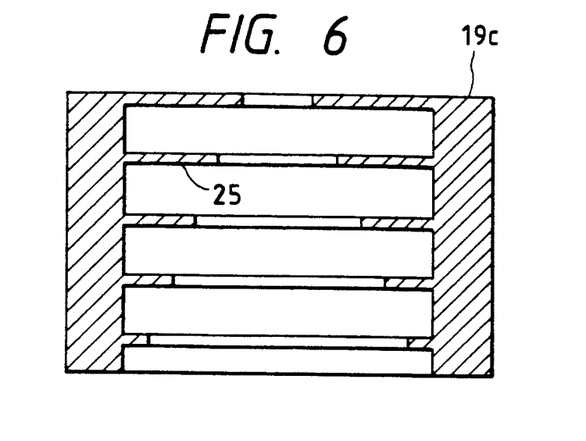
FIG. 6 is a longitudinal section showing another embodiment of the slow wave structure of the system of FIG. 1, in which the internal diameters of projections are varied.
Figure 7:
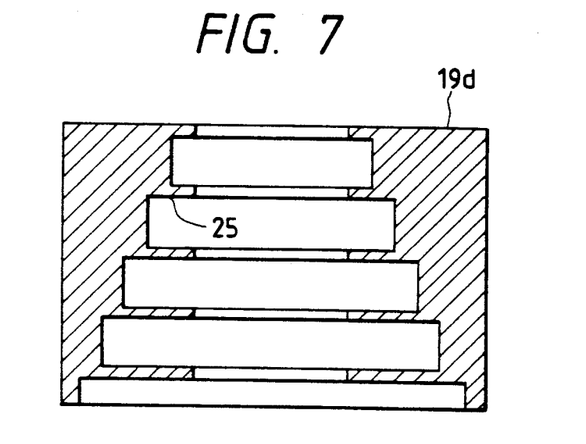
FIG. 7 is a longitudinal section showing another embodiment of the slow wave structure of the system of FIG. 1, in which the external diameters of projections are varied.
Figure 8:
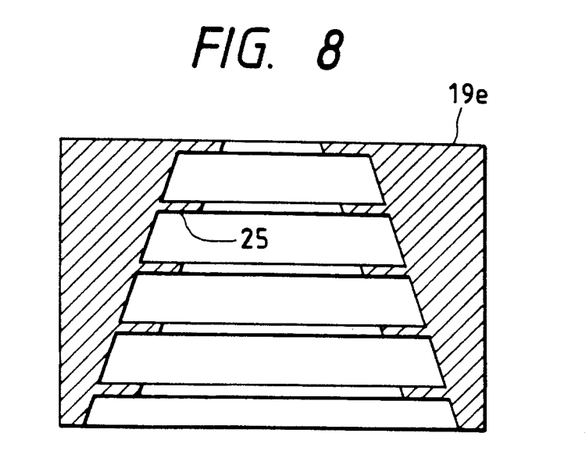
FIG. 8 is a longitudinal section showing another embodiment of the slow wave structure of the system of FIG. 1, in which the internal and external diameters of projections are varied.

In the present first embodiment, on the other hand, the disc-shaped projections 25 are arranged at a constant interval and have constant internal and external diameters. As shown in FIGS. 5 to 8, however, slow wave structures 19b to 19e may have their disc-shaped projections 25 arranged with different internal and external diameters and at different intervals. FIG. 5 shows an example, in which the projections 25 have their intervals changed while keeping their internal and external diameters constant. FIG. 6 shows an example, in which the projections 25 have their internal diameters changed while keeping their intervals and external diameters constant. FIG. 7 shows an example, in which the projections 25 have their external diameters changed while keeping their intervals and internal diameters constant. FIG. 8 shows an example, in which the projections 25 have their external and internal diameters changed while keeping their intervals constant. The slow wave structures 19b to 19e, as shown in FIGS. 5 to 8, are integrally formed, as has been exemplified in the first embodiment, but may be assembled, as shown in FIG. 4.

Other examples of the slow wave structure should not be limited to the slow wave structures 19a to 19e having the projections 25 shown in FIGS. 4 to 8 but can be naturally modified to adjust the phase velocity of the microwaves by changing the internal and external diameters and intervals suitably.

Figure 9:
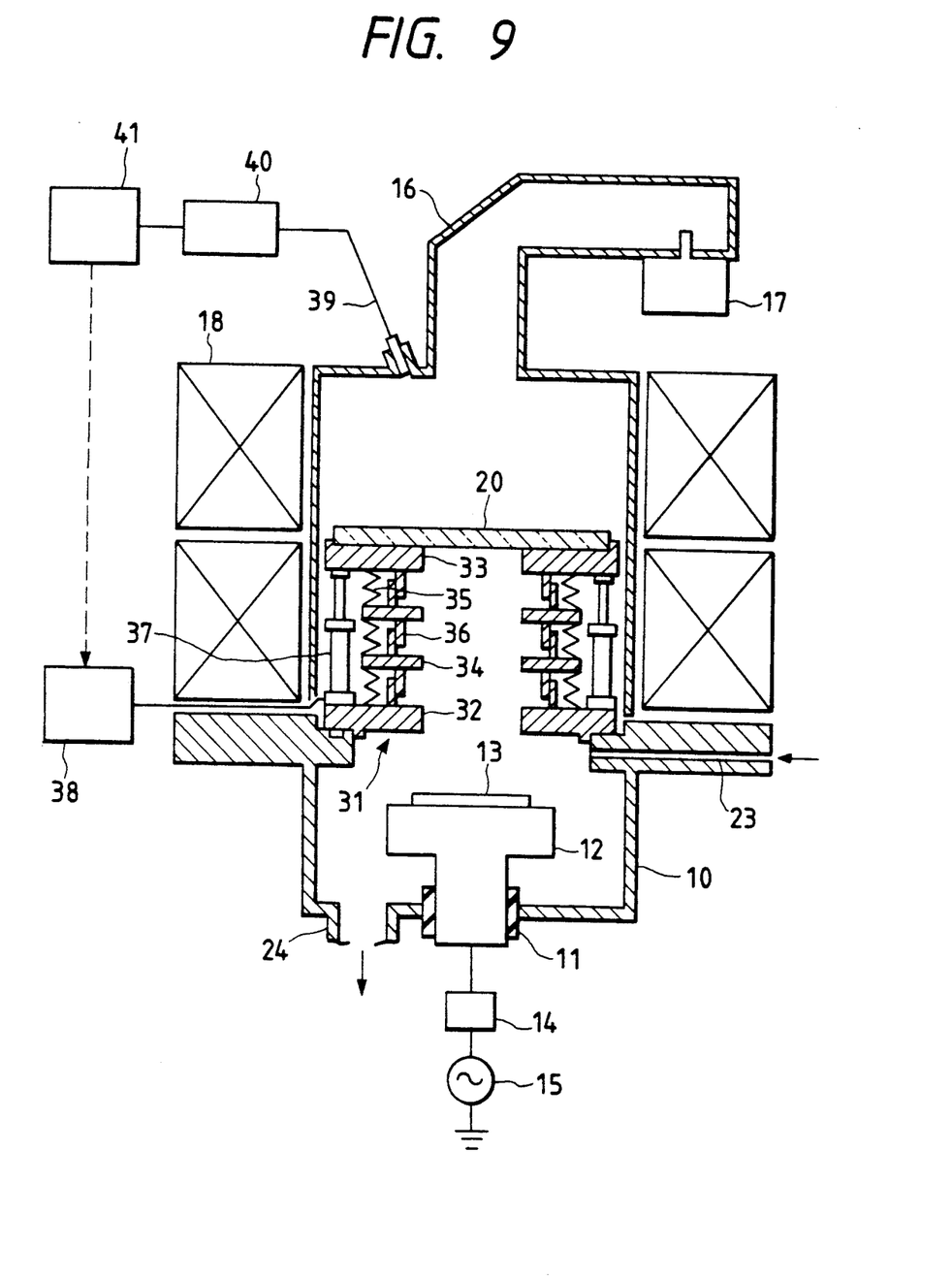
FIG. 9 is a longitudinal section showing a magnetic field microwave plasma etching system according to a second embodiment of the present invention.

Next, a second embodiment of the present invention will be described with reference to FIG. 9.

In the foregoing first embodiment, the intervals between the projections 25 of the slow wave structure 19 are fixed, but the plasma generating conditions such as the pressure, flow rate and type of gasses used may be changed over a wide range. Then, the optimum phase velocity of the microwaves becomes different. In the second embodiment, therefore, the intervals (or periods) of the projections of the slow wave structure can be adjusted. The parts of FIG. 9 which are the same as those of FIG. 1 are designated by the common reference numerals, and their descriptions will be omitted. The difference between the structure of FIG. 9 and that of FIG. 1 is that the period of the slow wave structure can be adjusted while the electron density in the plasma is being measured.

A slow wave structure 31 is constructed in this case by connecting a plurality of bellows 35 and discs 34 alternately between end plates 32 and 33, by arranging air cylinders 37 outside of the bellows 35 and between the end plates 32 and 33, and by fitting rings 36 on each of the discs 34 or one of the end plates 33 and 32 between the end plate 32 and the disc 34, between the discs 34 and between the end plate 33 and the disc 34 so as to be overlapped movably and partially. Moreover, the slow wave structure 31 is grounded to the earth potential.

Moreover, an optical fiber 39 is attached to that portion of the waveguide 16, which allows the plasma generating space in the slow wave structure 31 to be observed through the quartz window 20, and has its other end connected to a spectroscope 40 so that the output of the spectroscope 40 may be inputted to a control unit 41. To the air cylinders 37, on the other hand, there are connected a cylinder drive source 38 which can be controlled by the control unit 41.

According to the microwave plasma treating system thus constructed, the period of the slow wave structure 31 can be changed by extending or contracting the air cylinders 37 by the cylinder drive source 38. Moreover, the vacuum in the slow wave structure 31 can be held by the bellows 35. Since the optimum conditions for generating the plasma can thus be set over a wide range by changing the period of the slow wave structure 31, a plasma of higher density can be generated to improve the plasma treating rate.

In the present embodiment, on the other hand, the electron density in the plasma is measured by introducing the emission of light from the plasma through the optical fiber 39 into the spectroscope 40. This measurement result is inputted to the control unit 41, by which the cylinder drive source 38 is controlled to extend or contract the air cylinders 37 thereby to change the period of the slow wave structure 31 so that a plasma of high density may be generated in the plasma generating space in the vacuum treating chamber 10.

According to the present second embodiment, there can be attained not only an effect similar to that of the foregoing first embodiment but also another effect that the optimum state for generating the plasma can be established in accordance with the plasma treating conditions.

Incidentally, in the present second embodiment, the electron density in the plasma is measured by making use of the emission of light from the plasma so that the period of the slow wave structure 31 may be adjusted according to the measurement result of said electron density. Alternatively, the period of the slow wave circuit 31 may be controlled to generate a plasma of high density by measuring a high-frequency voltage Vpp applied to the specimen bed 12 with a high-frequency voltmeter and by estimating the electron density from the value of said high-frequency voltage Vpp. Moreover, the period of the slow wave structure 31 may be adjusted by measuring the output of the reflection of the microwaves.

On the other hand, the present second embodiment uses the method of adjusting the period of the slow wave structure 31 base on the electron density. In addition, if necessary, the period of the slow wave structure 31 may be adjusted by measuring the variables which are dependent upon the electron temperature, the ion density, the ion temperature, the radical density, the radical temperature or the like.

Next, a third embodiment of the present invention will be described with reference to FIG. 10.

Figure 10:
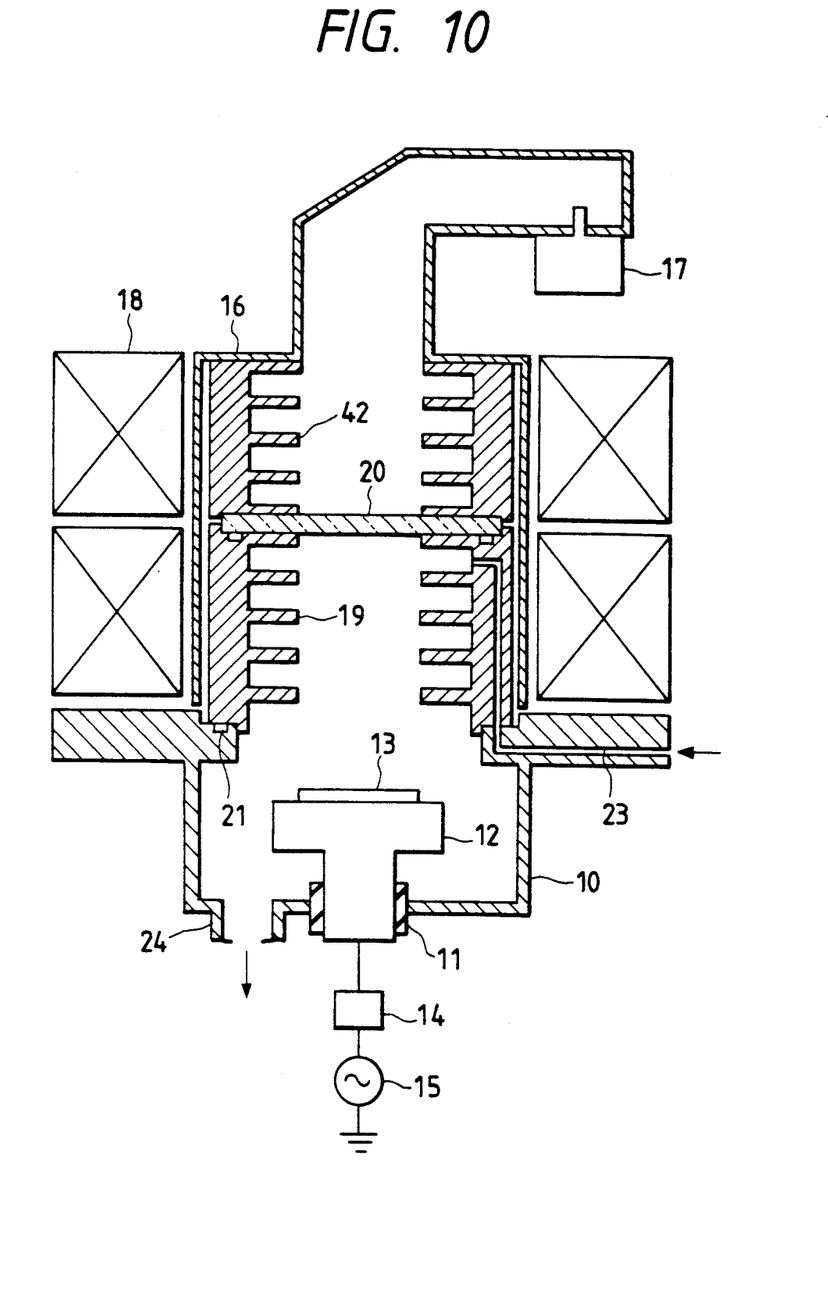
FIG. 10 is a longitudinal section showing a magnetic field microwave plasma etching system according to a third embodiment of the present invention.

In FIG. 10, parts which are the same as in FIG. 1 are designated by the common reference numerals, and their descriptions will be omitted. The difference between the structure of FIG. 10 and that of FIG. 1 is that a slow wave structure is also disposed in the waveguide and outside of the space defined by the slow wave structure 19 and the quartz window 20 in this case, namely, outside of the plasma generating region. In this case, a slow wave structure 42 formed like the slow wave structure 19 is disposed in the waveguide 16 in front of the quartz window 20, as taken in the traveling direction of the microwaves. The slow wave structure 42 is grounded to the earth potential. Moreover, the slow wave structures 19 and 42 are arranged as close as possible to each other and may be in contact with each other.

According to the third embodiment thus constructed, the microwaves can have their phase velocity delayed to some extent before they pass through the quartz window 20. As a result, the microwaves will not have their phase velocity abruptly changed after they have passed through the quartz window 20 so that their energy can be efficiently transformed into that of the charged particles in the plasma. Thus, the third embodiment can attain an effect that it can generate plasma of higher density than that of the foregoing first embodiment thereby to improve the plasma treating rate.

Next, a fourth embodiment of the present invention will be described with reference to FIG. 11.

Figure 11:
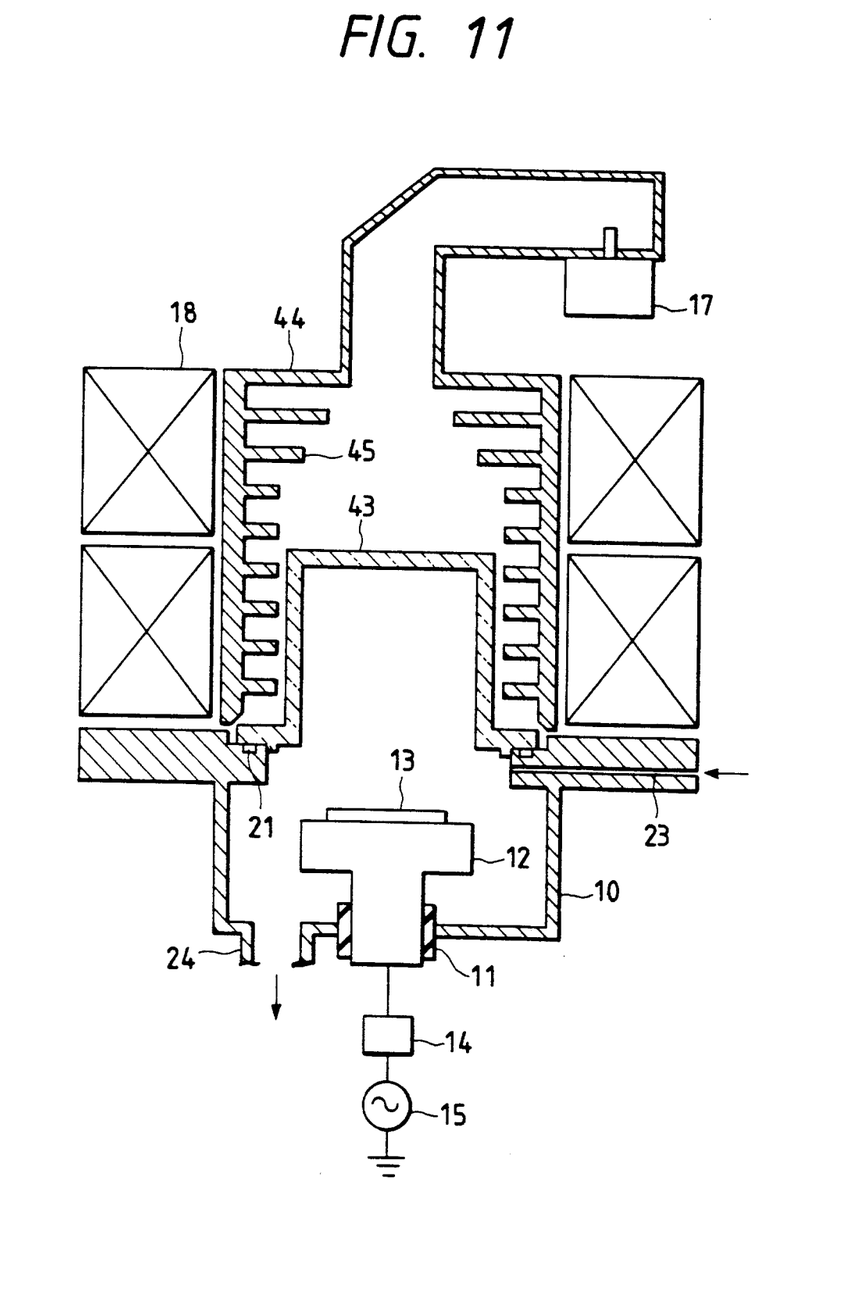
FIG. 11 is a longitudinal section showing a magnetic field microwave plasma etching system according to a fourth embodiment of the present invention.

In FIG. 11, the parts as those of FIG. 1 are designated by the common reference numerals, and their descriptions will be omitted. The difference between the structure of FIG. 11 and that of FIG. 1 is that a quartz bell jar is fitted gas-tight in the treating chamber and a slow wave structure integrally formed with the inner wall of the waveguide to enclose the quartz bell jar. In this case, a quartz bell jar 43, which bulges in the direction opposite to the traveling direction of the microwaves, is fitted gas-tight on the upper opening of the treating chamber 10, and a slow wave structure 45 is formed integrally with the inner wall of a waveguide 44, which faces the outer circumference of the quartz bell jar 43. Here, the internal diameter of the bulging portion of the quartz bell jar 43 is preferably made larger than at least the diameter of the specimen 13. In this case, moreover, the slow wave structure 45 has its internal diameter gradually increased from the portion, at which the internal diameter of the waveguide is drastically changed, so that it may propagate the microwaves smoothly.

According to the fourth embodiment thus constructed, there can be attained not only an effect similar to that of the foregoing first embodiment but also another effect that the plasma treatment can be accomplished with little contamination with heavy metals because the slow wave structure 45 is arranged outside of the plasma generating region defined by the quartz bell jar 43. Moreover, since the slow wave structure 45 is extended to above the quartz bell jar 43, the phase velocity of the microwaves having passed through the quartz bell jar 43 can be prevented from abruptly changing as in the foregoing third embodiment. Still moreover, since the slow wave structure is integrally formed in the waveguide, the waveguide can have a large effective inside space.

Next, a fifth embodiment of the present invention will be described with reference to FIG. 12.

Figure 12:
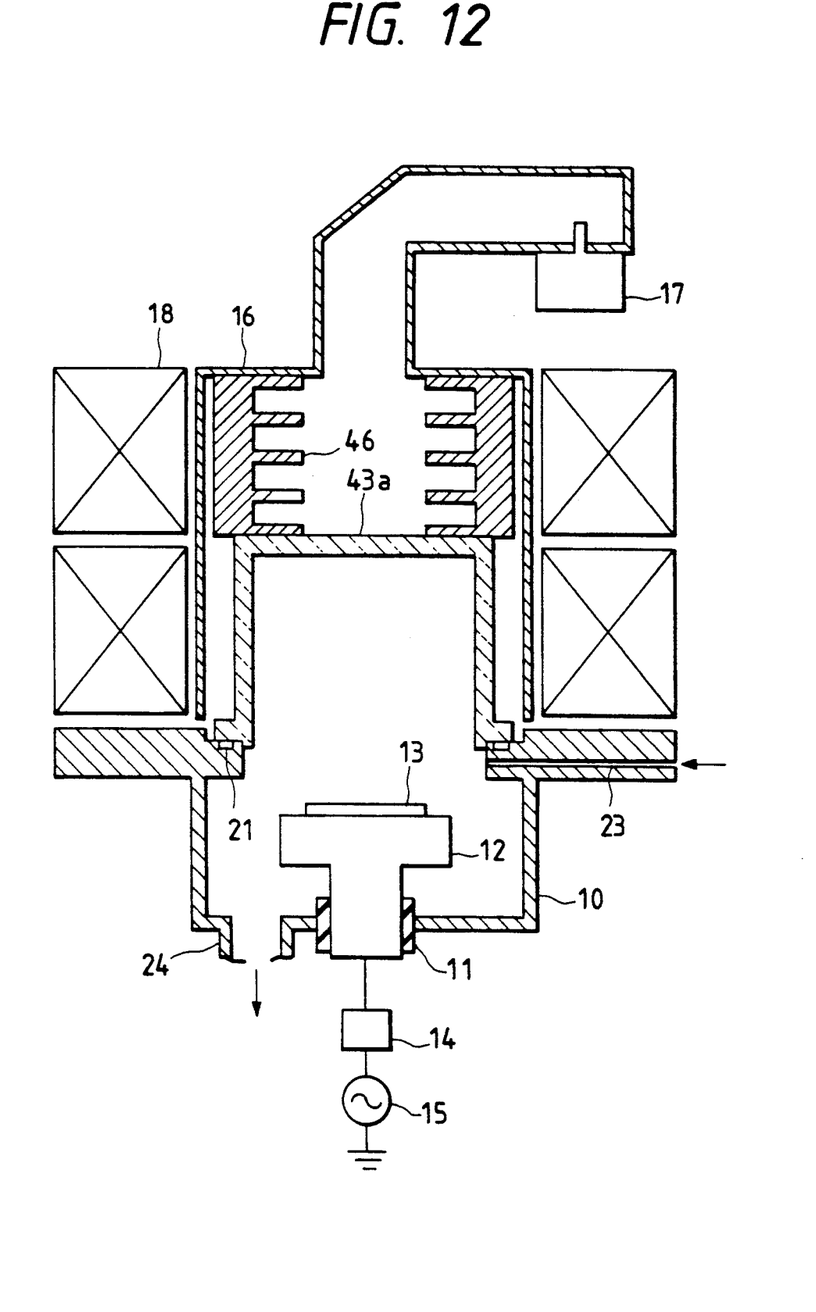
FIG. 12 is a longitudinal section showing a magnetic field microwave plasma etching system according to a fifth embodiment of the present invention.

In FIG. 12, the parts which are the same as those of FIGS. 1 and 11 are designated by the common reference numerals, and their descriptions will be omitted. The difference between the structure of FIG. 12 from that of FIG. 11 is that a slow wave structure is disposed outside of the plasma generating region inside of the wave guide. In this case, the slow wave structure 46 is fitted in the waveguide 16 in front of a quartz bell jar 43a, with respect to the traveling direction of the microwaves. Here, the end of the slow wave structure 46 and the quartz bell jar 43a are preferably disposed as close as possible to each other. Moreover, the clearance between them is smaller than the wavelength of the microwaves.

According to the fifth embodiment thus constructed, the slow wave structure is disposed outside of the plasma generating region as in the foregoing fourth embodiment. As a result, there can be attained effects that the plasma treatment can be accomplished with little contamination with heavy metals, and that the plasma can be generated over a wide range because the quartz bell jar can have a large internal diameter to treat a specimen having a large diameter.

Next, a sixth embodiment of the present invention will be described with reference to FIG. 13.

Figure 13:
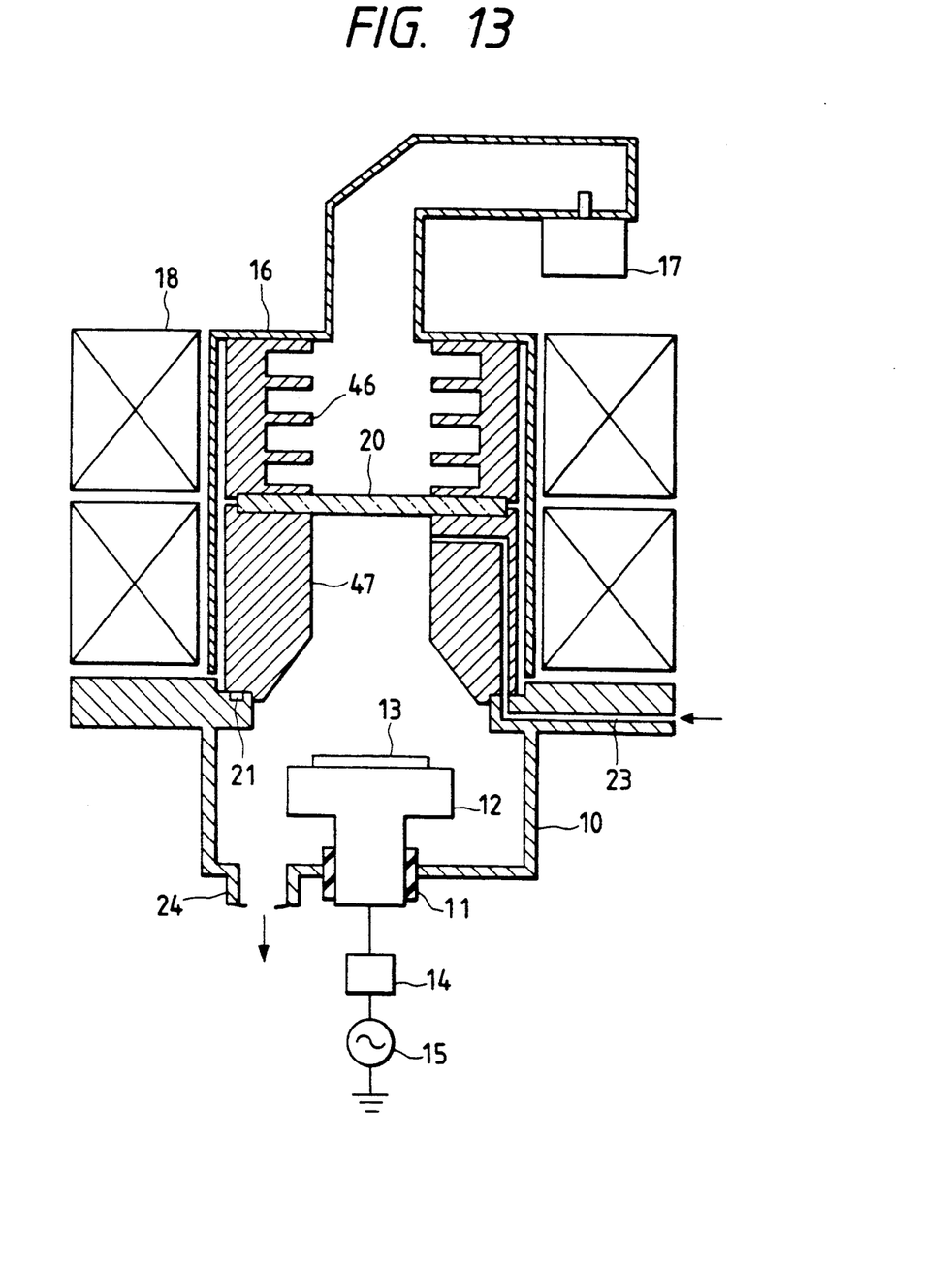
FIG. 13 is a longitudinal section showing a magnetic field microwave plasma etching system according to a sixth embodiment of the present invention.

In FIG. 13, the parts which are the same as those of FIGS. 1 and 12 are designated by the common reference numerals, and their descriptions will be omitted. The difference of the structure of FIG. 13 and that of FIG. 12 is that the quartz bell jar of FIG. 12 is replaced by the plasma generating chamber which is composed of both a discharge block 47 made of a non-magnetic and conductive material such as aluminum and the quartz window 20. In this case, the discharge block 47 is fitted gas-tight on the upper opening of the treating chamber 10, and the quartz window 20 is fitted in a gas-tight manner to the upper opening of the discharge block 47. In this case, moreover, the discharge block 47 has an internal diameter nearly equal to the external diameter of the specimen 13 and has its end tapered and widened toward the specimen bed 12. The discharge block 47 is grounded to the earth potential.

According to the sixth embodiment thus constructed, there can be attained not only an effect similar to that of the foregoing fifth embodiment but also another effect that the plasma can be homogeneously diffused to improve homogeneity of the plasma treatment because the end of the discharge block is tapered.

Next, a seventh embodiment of the present invention will be described with reference to FIG. 14.

Figure 14:
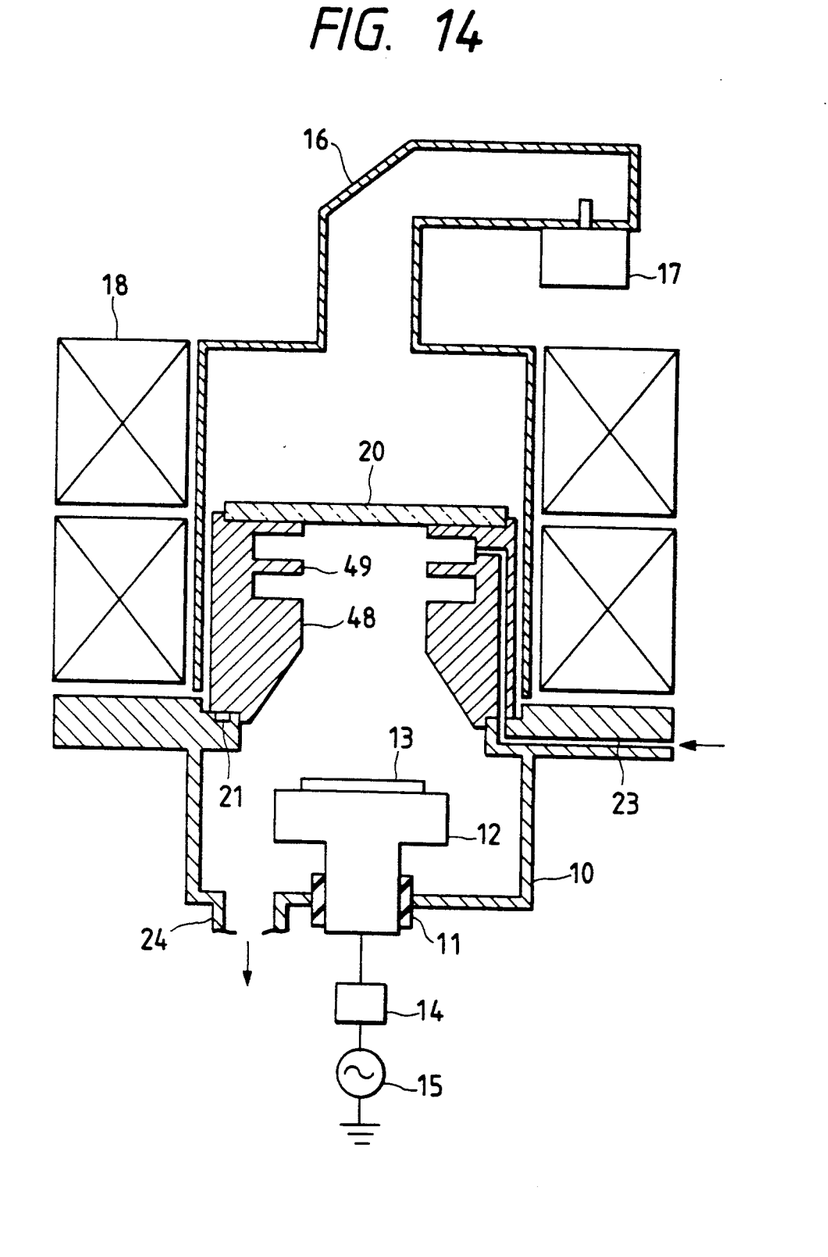
FIG. 14 is a longitudinal section showing a magnetic field microwave plasma etching system according to a seventh embodiment of the present invention.

In FIG. 14, the same parts which are the same as those of FIGS. 1 and 13 are designated by the common reference numerals, and their descriptions will be omitted. Unlike FIG. 13 where a slow wave structure is disposed outside of the plasma generating region, FIG. 14 shows a slow wave structure formed in a discharge block forming the plasma generating chamber. In this case, the slow wave structure 49 is formed in front of the discharge block 48, with respect to the traveling direction of the microwaves.

According to the seventh embodiment thus constructed, there can be attained not only an effect similar to that of the foregoing first embodiment but also an effect that the plasma can be uniformly diffused to improve the homogeneity of the plasma treatment because the discharge block has the tapered end as in the foregoing sixth embodiment.

Although the foregoing individual embodiments thus far described are directed to the magnetic field microwave plasma treating system, the present invention may be exemplified by a microwave plasma treating system using no magnetic field. Moreover, the descriptions are directed to the case in which the present invention is applied to the plasma etching system, but the present invention can be applied to any microwave plasma based system such as a plasma CVD system, an ashing system, and an ion or light source system using the microwave plasma. The ion source system may be exemplified by an ion source for an ion implantation system.

Figure 15:
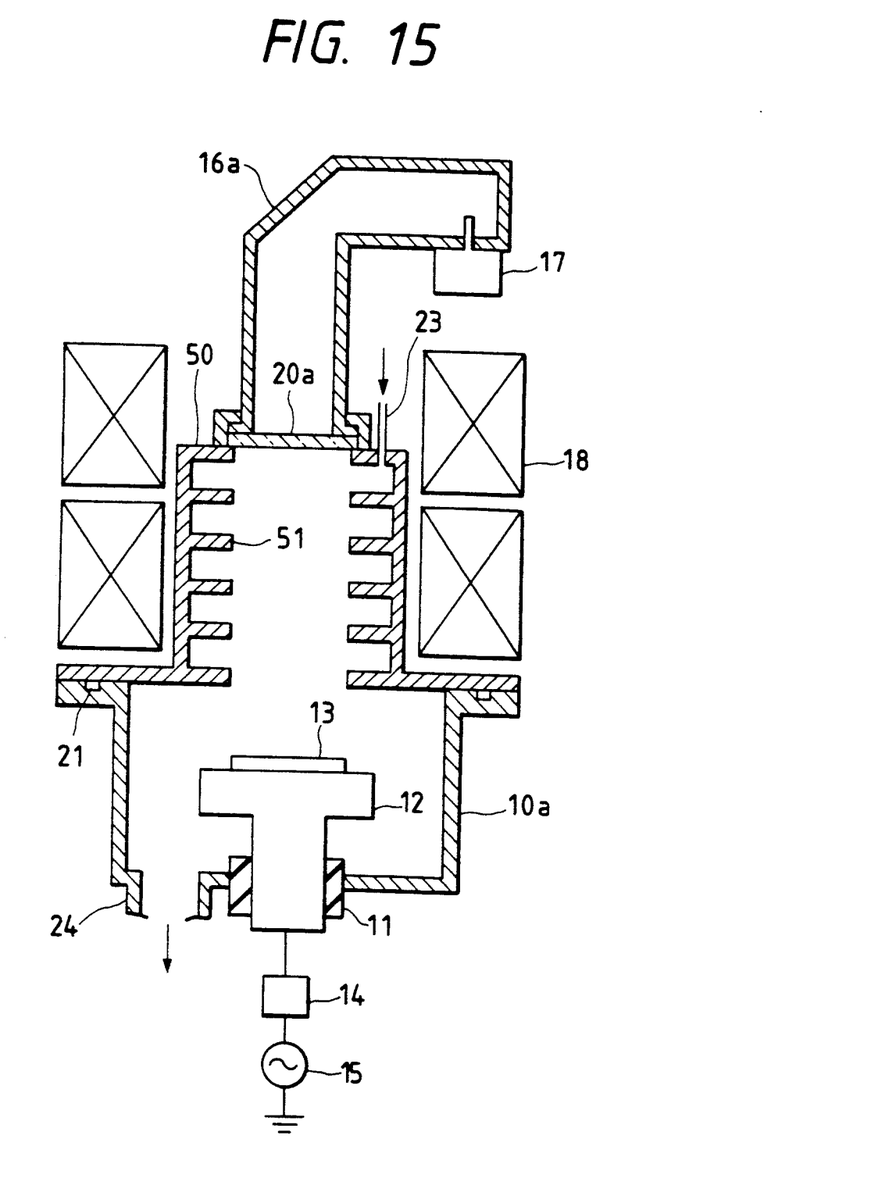
FIG. 15 is a longitudinal section showing a magnetic field microwave plasma etching system according to an eighth another embodiment of the present invention.

The foregoing individual embodiments thus far described are directed to the structures, in which the slow wave structure, quartz bell jar or discharge block forming the plasma generating chamber is enclosed by the waveguide, but this waveguide may be connected directly to the plasma generating chamber, as exemplified in FIG. 15. In FIG. 15, the parts which are the same as those of FIG. 1 are designated by the common reference numerals, and their descriptions will be omitted. The difference between the structure of FIG. 15 that of FIG. 1 is that the waveguide is connected directly to the upper portion of the slow wave structure. In this case, a plasma generating chamber 50 is formed over the upper opening of a treating chamber 10a. The plasma generating chamber 50 is provided on its inner wall with a slow wave structure 51. A quartz window 20a is fitted gas-tight on the upper opening of the plasma generating chamber 50, which in turn is connected to a waveguide 16a through the quartz window 20a. According to the embodiment of FIG. 15 thus constructed, too, there can be attained an effect similar to that of the foregoing first embodiment.

Moreover, the slow wave structure described in this case is exemplified by a disc-shaped structure which provides a wide space but may be formed into a groove-shaped structure which provides a narrow space. Still moreover, similar effects can be attained if the slow wave structure is constructed of a helical coil or ring electrode or the like.

Furthermore, the slow wave structures, as shown in FIGS. 4 to 8, can be used in an acceleration tube in a linear accelerator, in a traveling-wave tube for generating microwaves, or in a free electron laser.

As has been described hereinbefore, according to the present invention, the microwaves can have their phase velocity adjusted to a velocity, at which charged particles having similar velocities are most frequent, by using the slow wave structure in the propagation region of the microwaves. Thus, there can be attained an effect that a plasma of high density can be generated to improve the plasma treating rate.

What is claimed is:

1. A microwave plasma generating apparatus comprising:
    a plasma generating chamber for containing a plasma, including charged particles, generated from a gas introduced into the plasma generating chamber, the plasma being generated by an interaction between the gas in the plasma generating chamber and at least an electric field of microwaves introduced into the plasma generating chamber, the microwaves having a phase velocity;
    a waveguide for introducing the microwaves into the plasma generating chamber, the waveguide having an inner wall and a longitudinal axis; and
    a slow wave structure disposed in the waveguide for delaying the phase velocity of the microwaves at least before the interaction generating the plasma occurs, the slow wave structure including a plurality of disc-shaped projections protruding from the inner wall of the waveguide and coaxially aligned with the longitudinal axis of the waveguide, the disc-shaped projections being integral with the inner wall of the waveguide;
    wherein the slow wave structure delays the phase velocity of the microwaves in accordance with a velocity of the charged particles so as to increase an efficiency of an energy transfer between the microwaves and the charged particles of the plasma which occurs during the generation of the plasma.

2. A microwave plasma treating apparatus according to claim 1, wherein the plasma generating chamber is a quartz bell jar disposed in the waveguide inside the slow wave structure.

3. A microwave plasma treating apparatus according to claim 1, wherein the charged particles of the plasma have respective velocities, and wherein the slow wave structure delays the phase velocity of the microwaves to a value of phase velocity substantially equal to one of the velocities of the charged particles, thereby increasing an efficiency of an energy transfer between the microwaves and the charged particles of the plasma which occurs during the generation of the plasma.

4. A microwave plasma treating apparatus according to claim 1, wherein the charged particles of the plasma have velocities distributed according to a velocity distribution, and wherein the slow wave structure delays the phase velocity of the microwaves to a value of phase velocity substantially equal to a velocity in the velocity distribution possessed by a greatest number of the charged particles, thereby increasing an efficiency of an energy transfer between the microwaves and the charged particles of the plasma which occurs during the generation of the plasma.

5. A microwave plasma generating apparatus comprising:
    a plasma generating chamber;
    means for introducing a gas into the plasma generating chamber;
    means for generating microwaves having an electric field and a phase velocity;
    a slow wave structure coupling the means for generating microwaves to the plasma generating chamber for receiving the generated microwaves and delaying the phase velocity of the generated microwaves so that the microwaves having the delayed phase velocity are introduced into the plasma generating chamber, the slow wave structure including a cylinder having an inner surface, a longitudinal axis, and a plurality of disc-shaped projections protruding from the inner surface of the cylinder and coaxially aligned with the longitudinal axis of the cylinder; and
    means for generating a plasma, including charged particles, from the gas in the plasma generating chamber by causing the gas in the plasma generating chamber to interact with at least the electric field of the microwaves having the delayed phase velocity;
    wherein the charged particles of the plasma have velocities distributed according to a velocity distribution, and wherein the slow wave structure delays the phase velocity of the generated microwaves to a value of phase velocity substantially equal to a velocity in the velocity distribution possessed by a greatest number of the charged particles, thereby increasing an efficiency of an energy transfer between the generated microwaves and the charged particles of the plasma which occurs during the generation of the plasma.

6. A microwave plasma generating apparatus according to claim 5, wherein the slow wave structure is disposed outside the plasma generating chamber so as to delay the phase velocity of the generated microwaves outside the plasma generating chamber.

7. A microwave plasma generating apparatus according to claim 5, wherein the slow wave structure comprises a non-magnetic conductive material.

8. A microwave plasma generating apparatus according to claim 5, wherein the slow wave structure further includes dielectric members disposed between the disc-shaped projections.

9. A microwave plasma generating apparatus according to claim 5, wherein the cylinder of the slow wave structure is constituted by a plurality of discs separated by a plurality of spacers having respective inner surfaces, the inner surfaces of the spacers constituting the inner surface of the cylinder and the discs constituting the disc-like projections.

10. A microwave plasma generating apparatus according to claim 9, wherein the slow wave structure further includes dielectric members disposed between the discs adjacent to the spacers.

11. A microwave plasma generating apparatus according to claim 5, wherein the disc-shaped projections are disposed equidistantly at a pitch along the longitudinal axis of the cylinder.

12. A microwave plasma generating apparatus according to claim 11, wherein the generated microwaves have a guide wavelength, and wherein the pitch at which the disc-shaped projections are equidistantly disposed along the longitudinal axis of the cylinder is equal to 1/N of the guide wavelength, N being a positive integer.

13. A microwave plasma generating apparatus according to claim 11, further comprising means for varying the pitch at which the disc-shaped projections are equidistantly disposed along the longitudinal axis of the cylinder.

14. A microwave plasma generating apparatus according to claim 5, wherein the disc-shaped projections are disposed unequidistantly along the longitudinal axis of the cylinder.

15. A microwave plasma generating apparatus according to claim 5, wherein the slow wave structure is disposed inside the plasma generating chamber so as to delay the phase velocity of the generated microwaves inside the plasma generating chamber.

16. A microwave plasma generating apparatus according to claim 5, wherein the slow wave structure is disposed both inside and outside the plasma generating chamber so as to delay the phase velocity of the generated microwaves both inside and outside the plasma generating chamber.

17. A microwave plasma generating method comprising the steps of:
introducing a gas into a plasma generating chamber;
generating microwaves having an electric field and a phase velocity;
delaying the phase velocity of the generated microwaves with a slow wave structure including a cylinder having an inner surface, a longitudinal axis, and a plurality of disc-shaped projections protruding from the inner surface of the cylinder and coaxially aligned with the longitudinal axis of the cylinder; and
generating a plasma, including charged particles, from the gas in the plasma generating chamber using the microwaves having the delayed phase velocity by causing the gas in the plasma generating chamber to interact with at least the electric field of the microwaves having the delayed phase velocity;
wherein the charged particles of the plasma have velocities distributed according to a velocity distribution, and wherein the step of delaying the phase velocity of the generated microwaves includes delaying the phase velocity of the generated microwaves to a value of phase velocity substantially equal to a velocity in the velocity distribution possessed by a greatest number of the charged particles, thereby increasing an efficiency of an energy transfer between the generated microwaves and the charged particles of the plasma which occurs during the step of generating the plasma.

18. A microwave plasma generating method according to claim 17, wherein at least a portion of the slow wave structure is disposed inside the plasma generating chamber such that the step of delaying the phase velocity of the generated microwaves includes delaying the phase velocity of the generated microwaves at least inside the plasma generating chamber.

19. A microwave plasma generating method according to claim 17, wherein at least a portion of the slow wave structure is disposed outside the plasma generating chamber such that the step of delaying the phase velocity of the generated microwaves includes delaying the phase velocity of the generated microwaves at least outside the plasma generating chamber.

* * * * *